(12) United States Patent
Brand

(10) Patent No.: US 10,952,339 B2
(45) Date of Patent: Mar. 16, 2021

(54) FOLDING DEVICES

(71) Applicant: Intel Corporation, Santa Clara, CA (US)

(72) Inventor: Jason M. Brand, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/578,869

(22) Filed: Sep. 23, 2019

(65) Prior Publication Data

US 2020/0120821 A1 Apr. 16, 2020

Related U.S. Application Data

(63) Continuation of application No. 15/856,031, filed on Dec. 27, 2017, now Pat. No. 10,426,051.

(51) Int. Cl.
| | |
|---|---|
| *G06F 1/16* | (2006.01) |
| *H05K 5/02* | (2006.01) |
| *H05K 5/00* | (2006.01) |
| *E05F 3/20* | (2006.01) |
| *E05D 3/02* | (2006.01) |
| *E05F 1/12* | (2006.01) |

(52) U.S. Cl.
CPC ........... *H05K 5/0226* (2013.01); *E05D 3/022* (2013.01); *E05F 1/12* (2013.01); *E05F 3/20* (2013.01); *G06F 1/16* (2013.01); *G06F 1/1652* (2013.01); *G06F 1/1681* (2013.01); *H05K 5/0017* (2013.01); *E05Y 2900/606* (2013.01); *G06F 1/1616* (2013.01)

(58) Field of Classification Search
CPC .... G06F 1/1652; G06F 1/1616; G06F 1/1681; H05K 5/0226
USPC ........................................ 361/679.21, 679.27
See application file for complete search history.

(56) References Cited

U.S. PATENT DOCUMENTS

| | | | |
|---|---|---|---|
| 8,787,016 B2 | 7/2014 | Rothkopf et al. | |
| 9,064,431 B2 | 6/2015 | Ahn et al. | |
| 9,119,316 B2 * | 8/2015 | Lee | .......... G09F 9/301 |

(Continued)

FOREIGN PATENT DOCUMENTS

| | | |
|---|---|---|
| WO | 2011141742 | 11/2011 |
| WO | 2017111837 | 6/2017 |

OTHER PUBLICATIONS

CNET, "Six Ways to Play with Acer's Aspire R 13," Sep. 3, 2014, 3 pages. <https://www.cnet.com/products/acer-aspire-r-13/preview/>.

(Continued)

*Primary Examiner* — Anthony Q Edwards
(74) *Attorney, Agent, or Firm* — Hanley, Flight & Zimmerman, LLC

(57) ABSTRACT

Folding devices are disclosed. An example folding device includes a first frame; a second frame; an actuator including a first end coupled to the first frame and a second end hingably coupled to the second frame; and a display coupled to the first and second frames, when the folding device is in a folded position, the display wraps around ends of the first and second frames to cover a joint between the first and second frames, when the folding device rotates from the folded position toward an unfolded position, the actuator urges the ends of the first and second frames away from one another to encourage the display to unwrap from around the ends.

17 Claims, 6 Drawing Sheets

(56) References Cited

U.S. PATENT DOCUMENTS

| | | | |
|---|---|---|---|
| 9,541,962 B2 | 1/2017 | Siddiqui | |
| 9,894,782 B2 | 2/2018 | Dong | |
| 10,008,135 B2 | 6/2018 | Lim | |
| 10,426,051 B2 | 9/2019 | Brand | |
| 10,481,641 B2* | 11/2019 | Lee | G06F 1/1616 |
| 2010/0043174 A1 | 2/2010 | Bestle et al. | |
| 2012/0002360 A1* | 1/2012 | Seo | G06F 1/1652 |
| | | | 361/679.01 |
| 2012/0044620 A1 | 2/2012 | Song et al. | |
| 2012/0307423 A1 | 12/2012 | Bohn et al. | |
| 2012/0307472 A1 | 12/2012 | Bohn et al. | |
| 2012/0314399 A1 | 12/2012 | Bohn et al. | |
| 2013/0293444 A1* | 11/2013 | Sano | G06F 1/3262 |
| | | | 345/1.3 |
| 2014/0213324 A1 | 7/2014 | Tan et al. | |
| 2015/0116917 A1* | 4/2015 | Aono | G06F 1/1641 |
| | | | 361/679.04 |
| 2015/0257289 A1* | 9/2015 | Lee | H04M 1/0268 |
| | | | 361/749 |
| 2016/0302314 A1 | 10/2016 | Bae et al. | |
| 2017/0038798 A1* | 2/2017 | Lee | G06F 1/1616 |
| 2017/0272559 A1 | 9/2017 | Cavallaro et al. | |
| 2018/0049336 A1 | 2/2018 | Manuel et al. | |
| 2018/0242446 A1 | 8/2018 | Cho et al. | |
| 2018/0292863 A1 | 10/2018 | Escamilla | |
| 2018/0363341 A1 | 12/2018 | Siddiqui et al. | |
| 2019/0045646 A1 | 2/2019 | Brand | |

OTHER PUBLICATIONS

Herbst, "Dell Gets its Swivel on, Adds Three Devices to XPS Range," New Atlas, Aug. 30, 2012, 7 pages. <https://newatlas.com/dell-xps-range/23929/>.

Szczys, "Swiveling Arms Replace Laptop LCD Hinges," Hackaday, Nov. 8, 2010, 7 pages. <https://hackaday.com/2010/11/08/swiveling-arms-replace-laptop-lcd-hinges/>.

United States Patent and Trademark Office, "Non-Final Rejection," issued in connection with U.S. Appl. No. 15/856,031, dated Jan. 8, 2019 , 9 pages.

United States Patent and Trademark Office, "Notice of Allowance," issued in connection with U.S. Appl. No. 15/856,031, dated May 16, 2019 , 7 pages.

* cited by examiner

FOLDING DEVICES

RELATED APPLICATION

This patent arises from a continuation of U.S. patent application Ser. No. 15/856,031, filed on Dec. 27, 2017, now U.S. patent Ser. No. 10,426,051, and entitled "FOLDING DEVICES." U.S. patent application Ser. No. 15/856,031 is hereby incorporated by reference in its entity. Priority to U.S. patent application Ser. No. 15/856,031 is hereby claimed.

FIELD OF THE DISCLOSURE

This disclosure relates generally to devices, and, more particularly, to folding devices.

BACKGROUND

Some mobile devices include foldable displays. In some such examples, the displays are movable between a folded position and an unfolded position.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
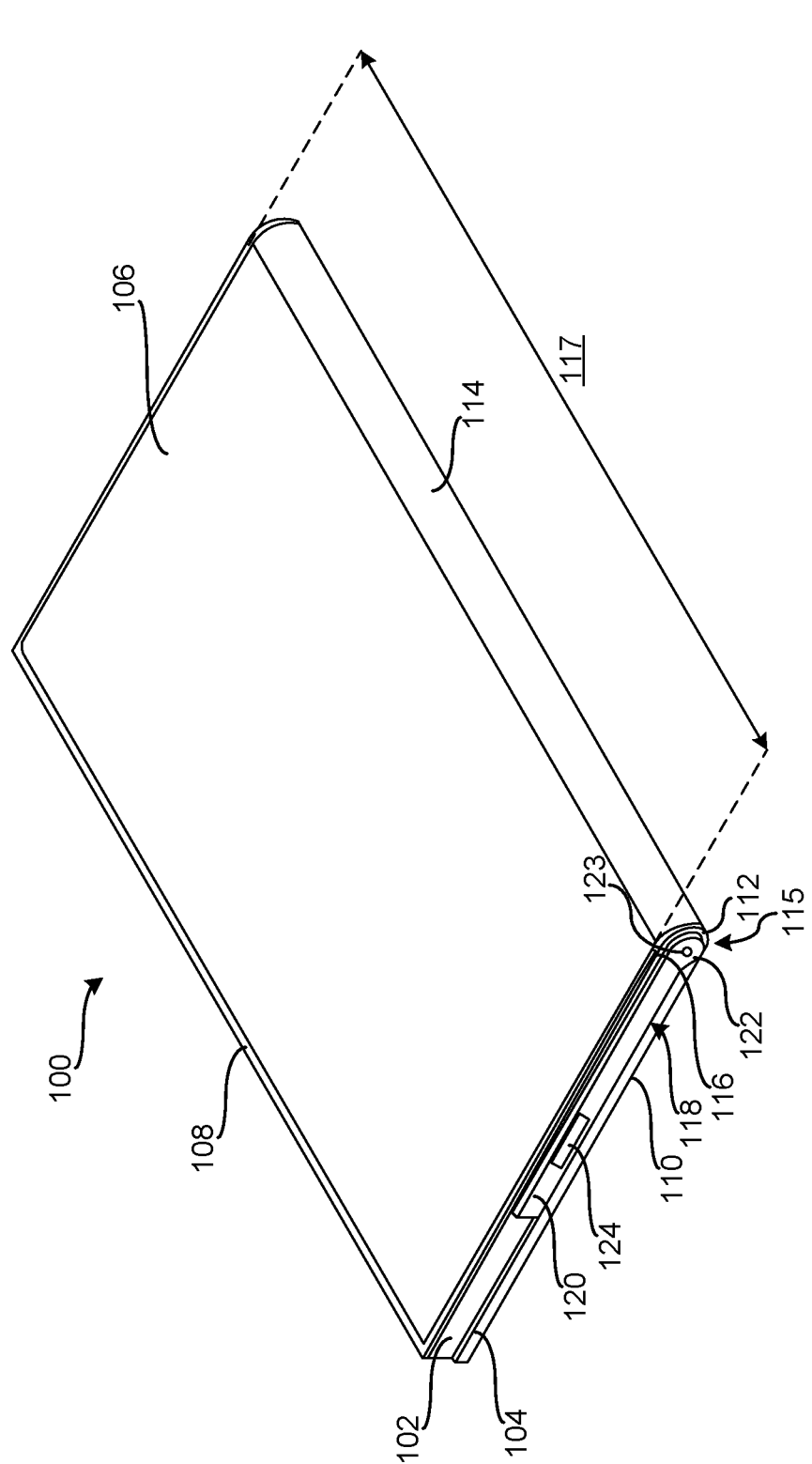
FIG. 1 illustrates an isometric view of an example folding device in a folded position.

The examples disclosed herein relate to example folding devices including displays that are structured to reduce stress and/or strain imparted on the displays and/or associated couplings as the folding devices move between a folded position and an unfolded position. The example displays may be implemented by flexible displays, foldable displays, active-matrix organic light-emitting diode (AMOLED) displays, electronic ink (eINK) displays, etc. The folding devices may be implemented by personal computers, personal digital assistants (PDAs) and/or mobile devices such as, for example, tablets, cell phones, smart phones, etc. having one or more outwardly facing displays.

In some examples, the folding devices enable stresses and/or strains on the displays to be controlled and/or enabled to satisfy a threshold by substantially simultaneously translating and rotating first and second portions of the folding device relative to one another as the folding device is moved from the folded position to the unfolded position and/or from the unfolded position to the folded position. As set forth herein, the phrase "substantially simultaneously" accounts for slight delays in translating and/or rotating the folding device caused by manufacturing tolerances.

In some examples, by translating the first and second portions relative to one another when the first and second portions are rotated relative to one another, tension is maintained at a coupling that bridges a gap between the first and second portions and/or that wraps around outside surfaces of the display device. In some examples, maintaining tension on the coupling deters the coupling from bunching and/or wrinkling as the folding device folds and/or unfolds. The coupling may be implemented by a portion of the display, a flexible membrane and/or flexible reinforcement material (e.g., a nitinol sheet, Kevlar). In some examples, the first portion of the folding device is implemented by a main chassis of the folding device and the second portion of the folding device is implemented by a wing chassis of the folding device.

To enable tension to be maintained on the display and/or the associated coupling at the joint between the main chassis and the wing chassis, in some examples, the folding device includes one or more actuators. The actuator may be movably coupled to the main chassis and rotatably coupled to the wing chassis.

In some examples, the actuators enable tension to be maintained on the display and/or the associated coupling by urging a first portion of the display away from a second portion of the display as the first and second portions rotate relative to one another. Thus, in this example, the actuator urges the coupling to unroll and/or roll in a desired and/or atheistically pleasing manner. Put another way, in some examples, the actuators drive the folding device open by urging the coupling to move toward the unfolded position by maintaining tension on the coupling. The actuators may be implemented by a push rod, a strut, a spring strut and/or a gas strut. However, any type of actuator may be used to implement the teachings of this disclosure.

The folding devices may include any number of actuators in one or more locations. For example, the actuators may be carried by the main chassis (e.g., the first portion) and hingably coupled to the wing chassis (e.g., the second portion). In some such examples, in the folded position, the actuator is received within and/or does not extend from the main chassis and, in the unfolded position, the actuator extends out from the main chassis to deter the coupling from bunching. In some examples, when the folding device is in the folded position, a spring of the actuator is in a first state of tension and, when the folding device is in the unfolded position, the spring of the actuator is in a second state of tension, where the first state of tension is higher than the second state of tension.

To enable the coupling to be supported and/or reinforced (e.g., rigidly reinforced) throughout the actuation process (e.g., opening and/or closing the folding device), in some examples, the wing chassis of the folding device includes an example cam. The cam may be carried at an end of the wing chassis and may include a pivot that is used to pivot the wing chassis and the main chassis relative to one another.

In some such examples, as the wing chassis is rotated toward and/or relative to the main chassis to place the folding device in the closed position, the coupling is taken up by and/or wrapped around the cam to decrease the distance between ends of the wing chassis and the main chassis and to urge the actuator toward the main chassis. When the folding device is disposed in the folded position, in some examples, the actuator is in the first state of tension and the cam is received in a receptacle of the main chassis to enable the coupling to be further supported.

FIG. 1 illustrates an example folding device 100 in accordance with the teachings of this disclosure. In this example, the folding device 100 includes an example first portion, a first frame and/or main chassis 102, an example second portion, a second frame and/or wing chassis 104 and an example display 106 that wraps around and/or is coupled to outward facing surfaces 108, 110 of the main chassis 102 and the wing chassis 104. In the illustrated example, the wing chassis 104 includes an example cam 112 around which an example coupling, bridge and/or hinge 114 of the display 106 is disposed when the folding device 100 is in the folded position as shown in FIG. 1. Thus, the example coupling 114 covers a joint 115 formed between the main chassis 102 and the wing chassis 104 when the folding device 100 is in the folded position and/or bridges a gap between ends of the main chassis 102 and the wing chassis 104 when the folding device 100 is in the unfolded position. The coupling 114 may be implemented by a portion of the display 106, a flexible membrane and/or a flexible reinforcement material.

To enable the cam 112 to further support the coupling 114 when the folding device 100 is in the folded position, in this example, the cam 112 is matingly received in an example receptacle and/or groove 116 formed at an end of the main chassis 102. In some examples, the interaction between the cam 112 and the receptacle 116 supports the coupling 114 to deter the coupling 114 from being urged inwardly and/or otherwise bent in a manner that may decrease the useful life of the coupling 114. In some examples, the cam 112 and the receptacle 116 extend a length 117 of the folding device 100. In other examples, the cam 112 and/or the receptacle 116 extend along portions of the length 117 and/or are intermittently disposed along the length 117.

To reduce stress and/or strain imparted on the display 106 of the folding device 100 as the folding device 100 moves between a folded position and an unfolded position, the example folding device 100 includes an example actuator 118. In this example, the actuator 118 is structured to enable the coupling 114 to rotate and translate as the main chassis 102 rotates relative to the wing chassis 104. While the example of FIG. 1 illustrates one actuator 118 on one side of the folding device 100, the folding device 100 may include another actuator on an opposing side of the folding device 100. In other examples, one or more actuators may be carried in any other way by the main chassis 102 and/or the folding device 100 including, for example, being received within a chamber and/or housing of the main chassis 102.

Figure 2:
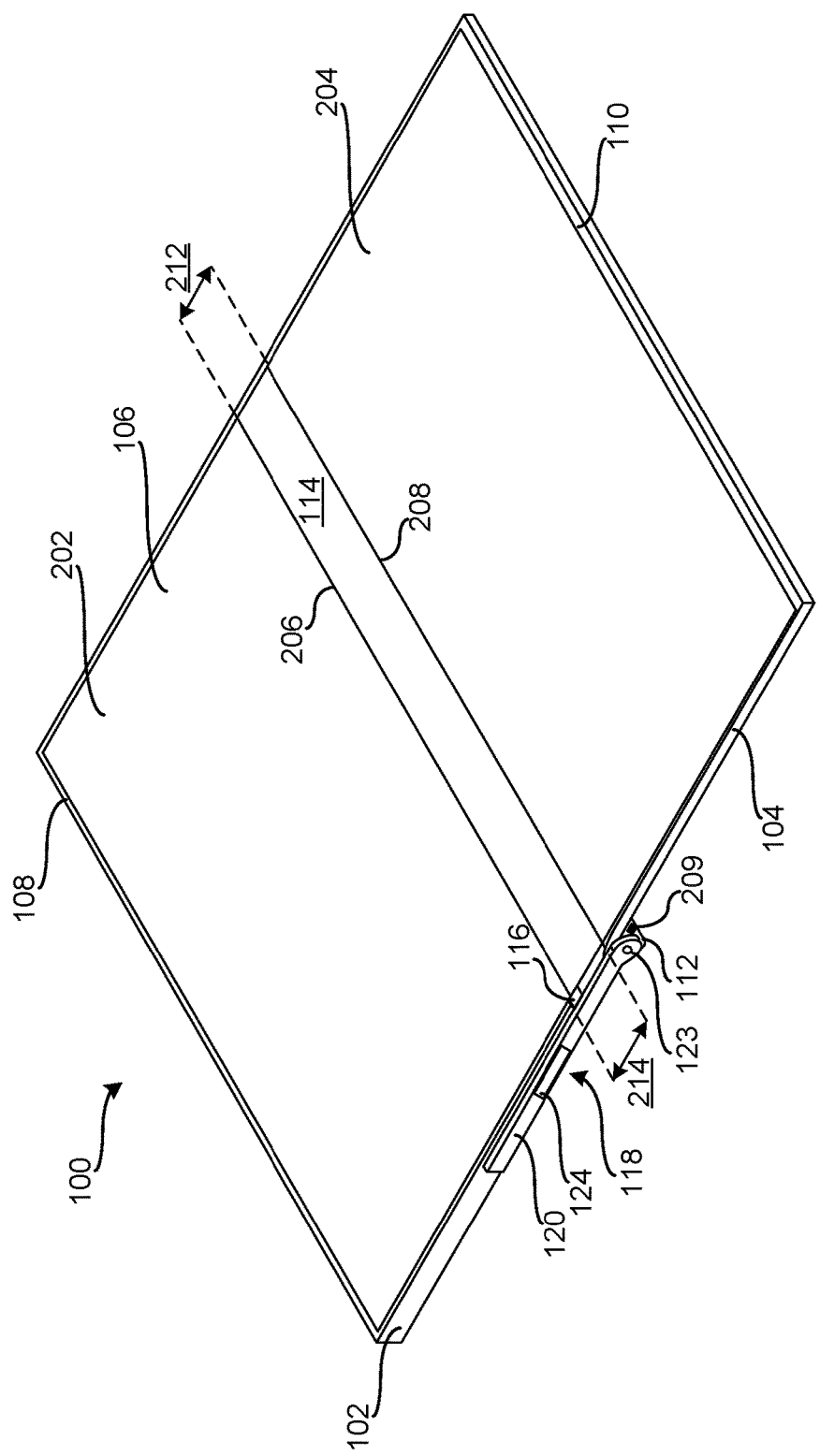
FIG. 2 illustrates an isometric view of the example folding device of FIG. 1 in an unfolded position.

In the illustrated example, the example actuator 118 includes an elongated portion 120 and an end 122. In this example, the elongated portion 120 is movably and/or slidably coupled to the main chassis 102 and the end 122 is hingably coupled to the wing chassis 104 at a pivot 123. To enable and/or to urge the coupling 114, the main chassis 102 and/or the wing chassis 104 to translate as the folding device 100 is moved from the folded position to the unfolded position, the example actuator 118 includes an example biasing element 124 that urges the elongated portion 120 of the actuator 118 to extend from the main chassis 102 as shown in FIG. 2. The biasing element 124 may be implemented by a spring.

FIG. 2 illustrates the example folding device 100 of FIG. 1 in the unfolded position. As shown in this example, in the unfolded position, a first portion 202 of the display 106, the coupling 114 and a second portion 204 of the display 106 are substantially flush relative to one another, where the coupling 114 is disposed between the first and second portions 202, 204 of the display 106. As set forth herein, the phrase "substantially flush" accounts for manufacturing tolerances including, for example, a first intersection and/or coupling 206 between the first portion 202 of the display 106 and the coupling 114 and a second intersection and/or coupling 208 between the coupling 114 and the second portion 204 of the display 106.

As shown in the example of FIG. 2, the actuator 118 is in an extended position to enable the coupling 114 to remain taut and/or to enable the tension imparted on the coupling 114 by the actuator 118 to satisfy a threshold. In some examples, to deter the folding device 100 from being over rotated and/or to deter the coupling 114 from being damaged, the example folding device 100 includes a stop 209 carried by one or more of the actuator 118, the cam 112 and/or the wing chassis 104.

In operation, when the main chassis 102 is rotated relative to the wing chassis 104 to move the folding device 100 to the unfolded position, in some examples, the wing chassis 104 rotates about the pivot 123, the coupling 114 unwraps from around the cam 112 and the actuator 118 urges the main chassis 102 away from the wing chassis 104. Moving the main chassis 102 away from the wing chassis 104 accommodates for a width 212 of the coupling 114 when the coupling 114 is in the flattened position shown in FIG. 2 and/or when the coupling 114 is not arched around the cam 112 (e.g., when the folding device 100 is in the unfolded position), for example.

In some examples, the actuator 118 drives the folding device 100 open by urging the coupling 114 to unfold and/or straighten while maintaining a threshold amount of tension on the coupling 114 to enable the coupling 114 to remain taut (e.g., not bunched) when the folding device 100 is in, moving toward and/or moving away from the unfolded position. In other words, without implementing the examples disclosed herein, the coupling 114 may be taut when the folding device 100 is in the folded position but the coupling 114 may bunch and/or form a wrinkle when the folding device 100 is in the unfolded position and/or when the folding device 100 is moving between one of the folded position and the unfolded position and the other of the folded position and the unfolded position. In this example, the interaction between the coupling 114, the actuator 118, the main chassis 102 and the wing chassis 104 dynamically provides a space 214 between the main chassis 102 and the wing chassis 104 that deters wrinkles from forming at the coupling 114. In some examples, to accommodate for an arc-length differential of the coupling 114 between the folded position shown in FIG. 1 and the unfolded position shown in FIG. 2, the space 214 increases and/or decreases based on an amount that the coupling 114 is unwrapped from around (e.g., unwound from) the cam 112.

Figure 3:
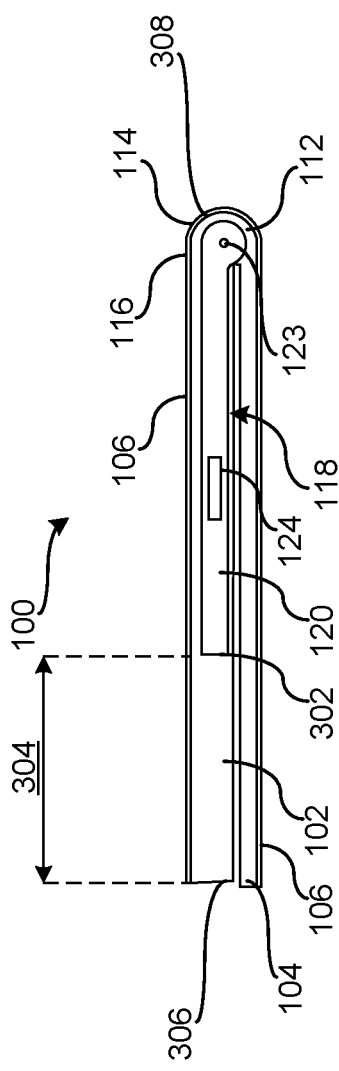
FIG. 3 illustrates a side view of the example folding device of FIG. 1 in the folded position.

FIG. 3 illustrates a side view of the example folding device 100 in the folded position. As shown in this example, an end 302 of the elongated portion 120 of the actuator 118 is disposed a first distance 304 from an edge 306 of the main chassis 102, the cam 112 is matingly received within the receptacle 116 and the coupling 114 is wrapped around an outer surface 308 of the cam 112. In some examples, the mating engagement between the cam 112 and the receptacle 116 enables the coupling 114 to be supported when the folding device 100 is in the closed position and the coupling 114 wraps around the outer surface 308 of the cam 112. Supporting the coupling 114 deters the coupling 114 from being damaged by, for example, bending the coupling 114 in a way that forms a radius and/or kink (e.g., wrinkle) that is less than a threshold. In examples in which the coupling 114 includes pixels (e.g., the coupling 114 is part of the display 106), bending the coupling 114 beyond a threshold may cause one or more of the pixels of the display 106 at the coupling 114 to be damaged and/or no longer function.

Figure 4:
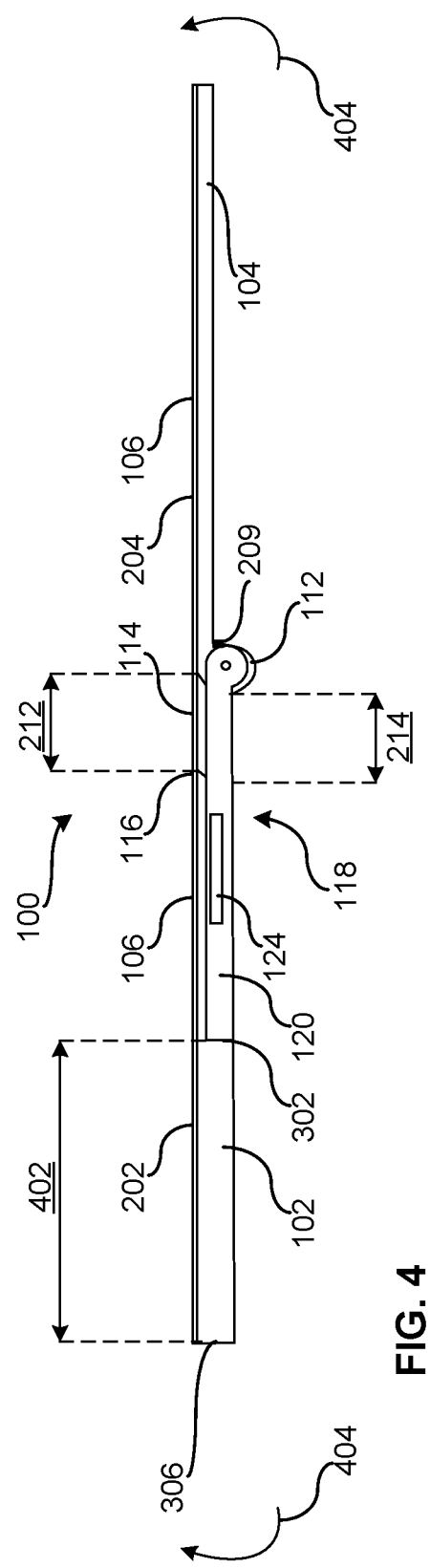
FIG. 4 illustrates a side view of the example folding device of FIG. 1 in the unfolded position.

FIG. 4 illustrates a side view of the example folding device 100 in the unfolded position. As shown in this example, the end 302 of the elongated portion 120 of the actuator 118 is disposed a second distance 402 from the edge 306 of the main chassis 102 and the cam 112 is spaced the distance 214 from the receptacle 116 to accommodate for the width 212 of the coupling 114 when the coupling 114 is in the flattened position. In the example of FIG. 4, the elongated portion 120 extends from and/or relative to the receptacle 116 and the actuator 118 maintains tension on the coupling 114 to enable the first portion 202 of the display 106, the coupling 114 and the second portion 204 of the display 106 to be substantially flush relative to one another. In this example, the stop 209 is shown discouraging the main chassis 102 and the wing chassis 104 from over rotating in a direction generally indicated by arrows 404.

Figure 5:
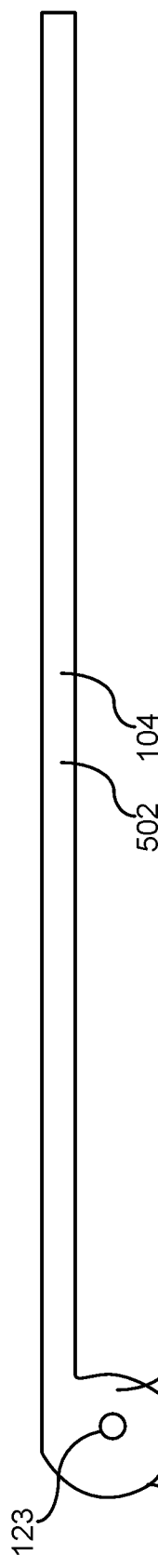
FIG. 5 illustrates a side view of an example wing chassis that can be used to implement the folding device of FIG. 1.

FIG. 5 illustrates a side view of the wing chassis 104 including the pivot 123 and the cam 112 having the outer surface 308 around which the coupling 114 wraps when the folding device 100 is in the folded position. As shown in the example of FIG. 5, the wing chassis 104 includes an elongated body 502 to which the display 106 is to be coupled. In some examples, the elongated body 502 forms a rectangular prism.

Figure 6:
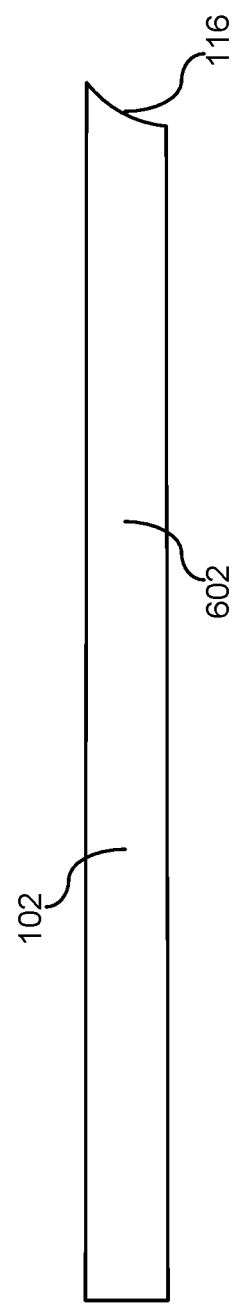
FIG. 6 illustrates a side view of an example main chassis that can be used to implement the folding device of FIG. 1.

FIG. 6 illustrates a side view of the main chassis 102 including the receptacle 116 that is structured to receive and/or house the cam 112 when the folding device 100 is in the folded position. As shown in the example of FIG. 6, the main chassis 102 includes an elongated body 602 to which the display 106 is to be coupled. In some examples, the elongated body 602 forms a rectangular prism.

Figure 7:
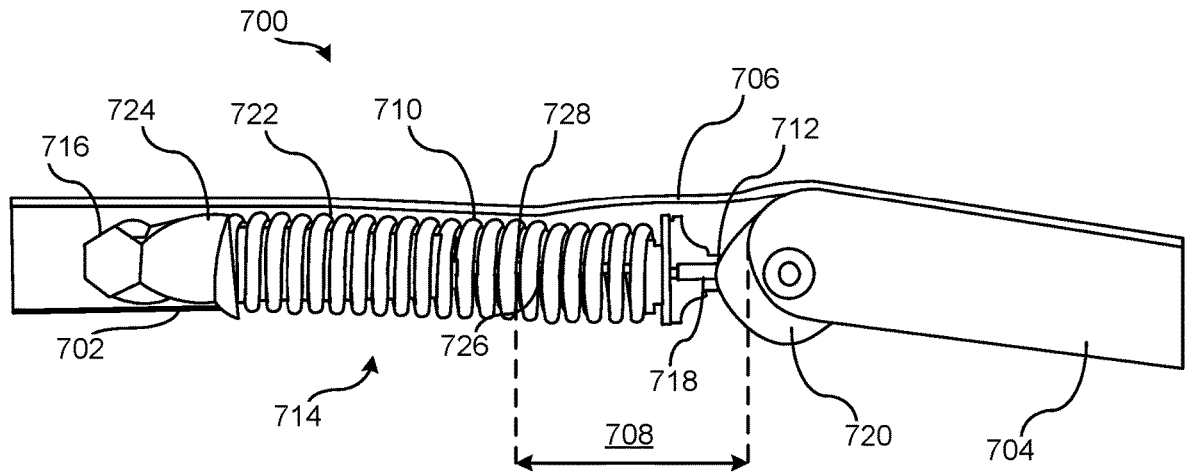
FIGS. 7-10 illustrate side views of an example folding device being moved from the unfolded position to the folded position.

FIGS. 7-10 illustrate an example folding device 700 being actuated from the unfolded and/or open position to the folded and/or closed position. Referring to FIG. 7, the example folding device 700 is shown in the unfolded position and includes an example first portion and/or a first frame 702, an example second portion and/or a second frame 704 and a coupling 706 that overlays the first and second portions 702, 704 and bridges a space and/or gap 708 between ends 710, 712 of the first and second portions 702, 704. In some examples, the first portion 702 is used to implement the main chassis 102 of FIG. 1, the second portion 704 is used to implement the wing chassis 104 of FIG. 1 and the coupling 706 is used to implement the coupling 114 of FIG. 1. In some examples, a display is coupled to the first and second portions 702, 704.

In this example, to urge the ends 710, 712 of the first and second portions 702, 704 away from one another as the folding device 700 moves toward the unfolded position and/or to substantially ensure that a threshold tension remains on the coupling 706, an example actuator 714 is coupled between the ends 710, 712 of the first and second portions 702, 704. In this example, the actuator 714 is implemented by a spring strut and includes a first end 716 pivotably coupled to the first portion 702, a second end 718 coupled to an example cam 720 of the second portion 704 and a spring 722 disposed between spring seats 724, 726. As shown in FIG. 7, when the folding device 100 is unfolded, a shaft 728 of the actuator 714 is in an extended position to position the first and second portions 702, 704 the distance 708 from one another.

Figure 8:
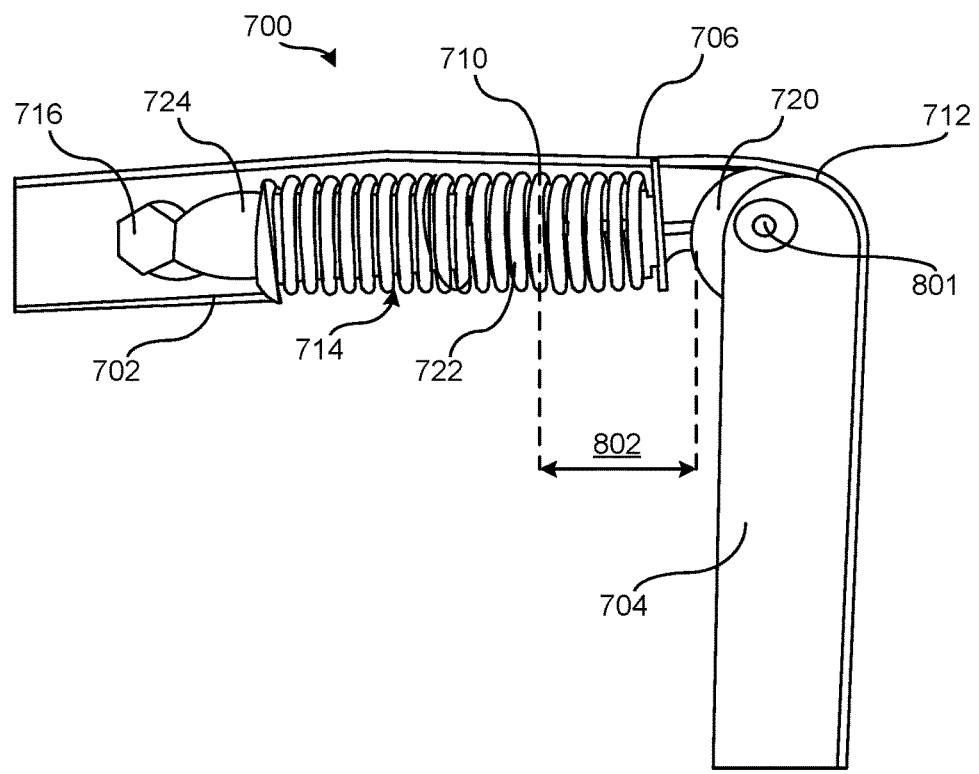

FIG. 8 illustrates the second portion 704 pivoting about an example pivot 801 and the coupling 706 wrapping around the cam 720 and causing a distance 802 between the ends 710, 712 of the first and second portions 702, 704 to decrease. In this example, as the coupling 706 wraps around the cam 720 decreasing the distance 802 between the end 710, 712, the spring 722 of the actuator 714 compresses.

Figure 9:
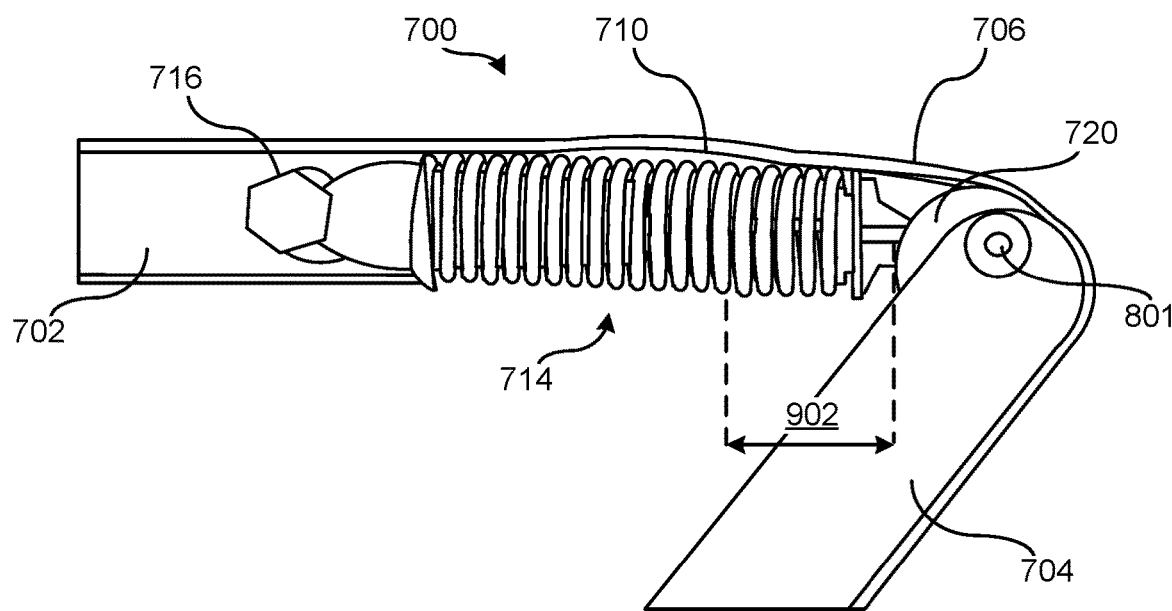

FIG. 9 illustrates the second portion 704 of the folding device 700 further pivoting about the example pivot 801, the coupling 706 further wrapping around the cam 720 and a distance 902 between the ends 710, 712 of the first and second portions 702, 704 being less than the distances 708, 802 of FIGS. 7 and 8.

Figure 10:
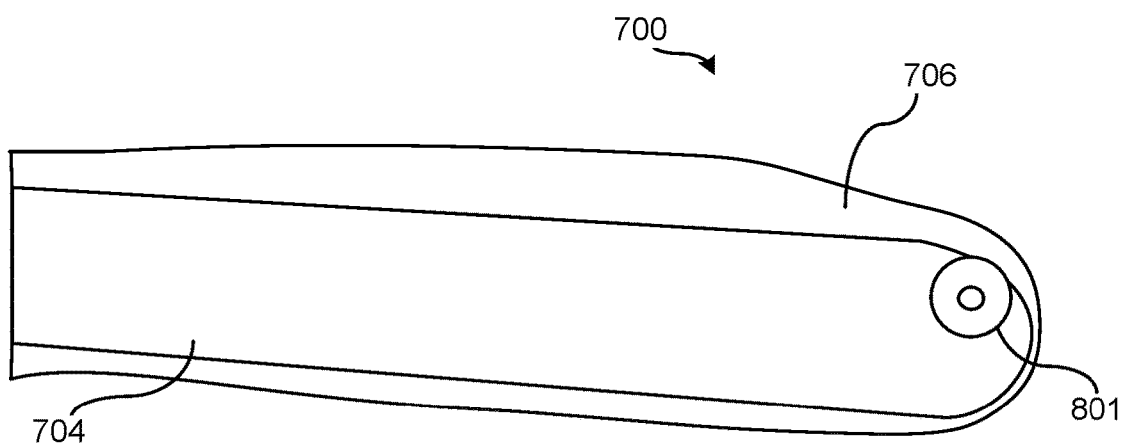

FIG. 10 illustrates the example folding device 700 in the folded and/or closed position with the coupling 706 wrapping around the cam 720. In the illustrated example, the actuator 118 is disposed between the first and second portions 702, 704. In some examples, the actuator 118 is enclosed and/or surrounded by the first and second portions 702, 704 (e.g., at least on two or three sides) when the folding device 700 is in the closed position.

From the foregoing, it will be appreciated that example methods, apparatus and articles of manufacture have been disclosed relating to folding devices including a flexible membrane and/or a flexible display, a main chassis, a wing chassis and a push arm. In the closed position, in some examples, the folding display and/or the flexible membrane wrap around a hinge joining the main chassis and the wing chassis. In some examples, when the display moves from the folded position to the unfolded position, the push arm pushes outward on the wing chassis to facilitate rotation and/or unfolding of the flexible membrane and to tension the flexible membrane throughout the unfolding/folding process. Thus, using the examples disclosed herein, flexible displays can be moved from the folded position to the unfolded position without experiencing a wrinkled look and/or without portions of the display buckling.

Example 1

An example folding device, includes a first frame; a second frame; an actuator including a first end coupled to the first frame and a second end hingably coupled to the second frame; and a display coupled to the first and second frames, when the folding device is in a folded position, the display wraps around ends of the first and second frames to cover a joint between the first and second frames, when the folding device rotates from the folded position toward an unfolded position, the actuator urges the ends of the first and second frames away from one another to encourage the display to unwrap from around the ends.

Example 2

In Example 1 or other examples, the first end of the actuator is movably coupled to the first frame.

Example 3

In Examples 1, 2 or other examples, the first frame is a main chassis and the second frame is a wing chassis.

Example 4

In Examples 1, 2 or other examples, the display includes a first display portion and a second display portion, the first display portion coupled to the first frame and the second display portion coupled to the second frame.

Example 5

In Example 4 or other examples, the display includes a third display portion coupled between the first display portion and the second display portion, when the folding device is in the folded position, the third display portion wraps around the ends of the first and second frames to cover the joint between the first and second frames.

Example 6

In Examples 1, 2 or other examples, the second frame further includes a cam around which the display wraps when the folding device is in the folded position.

Example 7

In Example 6 or other examples, when the folding device rotates from the folded position toward the unfolded position, the display unwraps from around the cam and the actuator urges the ends of the first and second frames away from one another.

Example 8

In Example 6 or other examples, when the folding device rotates from the unfolded position toward the folded position, the display wraps around the cam and decreases a distance between the ends of the first and second frames.

Example 9

In Example 8 or other examples, decreasing the distance between the ends of the first and second frames moves the actuator from an expanded position toward a contracted position.

Example 10

In Example 6 or other examples, the first frame includes a receptacle that receives the cam when the folding device is in the folded position, an interaction between the cam and the receptacle to provide support to the display wrapped around the cam when the folding device is in the folded position.

Example 11

In Examples 1, 2 or other examples, the folding device includes a stop to deter the first and second frames from over rotating.

Example 12

In Examples 1, 2 or other examples, the actuator includes first and second spring seats between which a spring is disposed, the spring to urge the display toward the unfolded position.

Example 13

In Examples 1, 2 or other examples, the display is coupled to outward facing surfaces of the first and second frames.

Example 14

An example folding device includes a first portion; a second portion; an actuator including a first end coupled to the first portion and a second end hingably coupled to the second portion; and a coupling coupled to outward facing surfaces of the first and second portions, when the folding device is in a folded position, the coupling wraps around ends of the first and second portions to cover a joint between the first and second portions, when the folding device rotates from the folded position toward an unfolded position, the actuator urges the ends of the first and second portions away from one another to encourage the coupling to unwrap from around the ends.

Example 15

In Example 14 or other examples, the first portion is a main chassis and the second portion is a wing chassis.

Example 16

In Examples 14, 15 or other examples, the folding device includes a display including a first display portion and a second display portion, the first display portion coupled to the first portion and the second display portion coupled to the second portion.

Example 17

In Example 16 or other examples, the first and second display portions are coupled via the coupling.

Example 18

In Example 17 or other examples, the display includes the coupling.

Example 19

In Examples 14, 15 or other examples, the second portion further includes a cam around which the coupling wraps when the folding device is in the folded position.

Example 20

In Example 19 or other examples, when the folding device rotates from the folded position toward the unfolded position, the coupling unwraps from around the cam and the actuator urges the ends of the first and second portions away from one another.

Example 21

In Example 19 or other examples, when the folding device rotates from the unfolded position toward the folded position, the coupling wraps around the cam and decreases a distance between the ends of the first and second portions.

Example 22

In Example 21 or other examples, decreasing the distance between the ends of the first and second portions moves the actuator from an expanded position toward a contracted position.

Example 23

In Example 19 or other examples, the first portion includes a receptacle that receives the cam when the folding device is in the folded position, an interaction between the cam and the receptacle to provide support to the coupling wrapped around the cam when the folding device is in the folded position.

Example 24

In Examples 14, 15 or other examples, the folding device includes a stop to deter the first and second portions from over rotating.

Example 25

In Examples 14, 15 or other examples, the actuator includes first and second spring seats between which a spring is disposed, the spring to urge the coupling toward the unfolded position.

Example 26

In Examples 14, 15 or other examples, the coupling includes a flexible membrane.

Example 27

An example folding device, includes a first portion; a second portion; a coupling coupled to outward facing surfaces of the first and second portions, when the folding device is in a folded position, the coupling wraps around ends of the first and second portions to cover a joint between the first and second portions; and means for maintaining tension on the coupling as the folding device moves from the folded position toward an unfolded position.

Example 28

In Example 27 or other examples, the means for maintaining the tension on the coupling includes an actuator.

Example 29

In Example 28 or other examples, when the folding device rotates from the folded position toward the unfolded position, the actuator urges the ends of the first and second portions away from one another to encourage the coupling to unwrap from around the ends without buckling.

Example 30

In Example 29 or other examples, the actuator maintains a threshold amount of tension on the coupling when the folding device moves from the folded position to the unfolded position.

Example 31

In Examples 27, 28 or other examples, the first portion is a main chassis and the second portion is a wing chassis.

Example 32

In Examples 27, 28 or other examples, the folding device includes a display including a first display portion and a second display portion, the first display portion coupled to the first portion and the second display portion coupled to the second portion.

Example 33

In Examples 27, 28 or other examples, when the folding device rotates from the folded position toward the unfolded position, the coupling unwraps from around a cam of the second portion and the means for maintaining the tension urges the ends away from one another.

Example 34

In Examples 27, 28 or other examples, when the folding device rotates from the unfolded position toward the folded position, the coupling wraps around a cam and decreases a distance between the ends of the first and second portions.

Example 35

In Example 34 or other examples, the first portion includes a receptacle that receives the cam when the folding device is in the folded position.

Example 36

An example folding device includes a first portion; a second portion; an actuator including a first end coupled to the first portion and a second end hingably coupled to the second portion; and a coupling coupled to the first and second portions, when the folding device is in a folded position, the coupling wraps around ends of the first and second portions to cover a joint between the first and second portions, when the folding device rotates from the folded position toward an unfolded position, the actuator urges the ends of the first and second portions away from one another to encourage the coupling to unwrap from around the ends.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A folding device comprising:
a first frame having an end;
a second frame having an end;
a display supported by the first frame and the second frame;
a cam; and
a spring to bias the end of the first frame and the end of the second frame away from one another, the spring to enable a distance between the end of the first frame and the end of the second frame to decrease in response to rotation of the folding device from an unfolded position to a folded position, a first end of the spring coupled to the first frame and a second end of the spring coupled to the cam.

2. The folding device of claim 1, wherein the second frame is pivotally coupled to the cam.

3. The folding device of claim 1, further including a flexible membrane overlaying a portion of the first frame and a portion of the second frame.

4. The folding device of claim 3, wherein the flexible membrane includes a portion of the display.

5. The folding device of claim 3, wherein the flexible membrane is to cover a joint between the first frame and the second frame when the folding device is in the folded position.

6. A foldable display device comprising:
a display;
a first frame to support a first portion of the display;
a second frame to support a second portion of the display;
a spring; and a cam to direct the first frame and the second frame to translate away from each other under influence of the spring when the second frame pivots in a first direction to move the foldable display device from a folded position to an unfolded position, the cam to urge at least a portion of the spring toward the first frame when the second frame pivots in a second direction to move the foldable display device from the unfolded position to the folded position.

7. The foldable display device of claim 6, wherein the spring is to compress when the second frame pivots in the second direction.

8. The foldable display device of claim 6, wherein the first frame is a main chassis and the second frame is a wing chassis.

9. The foldable display device of claim 6, further including a flexible membrane coupled to the first frame and the second frame.

10. The foldable display device of claim 9, wherein the flexible membrane is to cover a joint formed between the first frame and the second frame when the foldable display device is in the folded position.

11. The foldable display device of claim 9, wherein the spring is to maintain tension on the flexible membrane when the foldable display device is in the unfolded position.

12. The foldable display device of claim 6, wherein the cam is in a groove defined in an end of the first frame when the foldable display device is in the folded position.

13. The foldable display device of claim 12, wherein the first portion of the display is opposite the second portion of the display when the cam is in the groove.

14. The foldable display device of claim 6, further including a stop to prevent over rotation of the second frame in the first direction.

15. An apparatus comprising:
a display including a first display portion and a second display portion;
a first frame to support the first display portion, the first frame having an end;
a second frame to support the second display portion, the second frame having an end;
a cam, the second frame pivotally coupled to the cam; and
a spring to bias the end of the first frame and the end of the second frame away from one another, the spring to enable a distance between the end of the first frame and the end of the second frame to decrease when the second frame pivots away from the first frame.

16. The apparatus of claim 15, further including a flexible membrane between the first display portion and the second display portion.

17. The apparatus of claim 16, wherein the flexible membrane is to wrap around the cam when second frame pivots away from the first frame.

* * * * *